United States Patent
Towe (10) Patent No.: US 10,483,906 B1
(45) Date of Patent: Nov. 19, 2019

(54) PHOTOVOLTAIC SOLAR CONVERSION

(71) Applicant: Orenko Limited, Cambridge (GB)

(72) Inventor: Elias Towe, Pittsburgh, PA (US)

(73) Assignee: Orenko Limited, Cambridge (GB)

(*) Notice: Subject to any disclaimer, the term of this patent is extended or adjusted under 35 U.S.C. 154(b) by 0 days.

(21) Appl. No.: 16/163,143

(22) Filed: Oct. 17, 2018

(51) Int. Cl.
| | |
|---|---|
| *H02S 40/22* | (2014.01) |
| *F24S 23/00* | (2018.01) |
| *F24S 80/40* | (2018.01) |
| *F24S 40/55* | (2018.01) |
| *H02S 40/42* | (2014.01) |
| *H01L 31/042* | (2014.01) |
| *H01L 31/054* | (2014.01) |
| *H01L 31/0232* | (2014.01) |
| *H02S 20/32* | (2014.01) |
| *H02S 40/20* | (2014.01) |
| *F24S 30/00* | (2018.01) |

(52) U.S. Cl.
CPC ............. *H02S 40/22* (2014.12); *F24S 23/12* (2018.05); *F24S 40/55* (2018.05); *F24S 80/40* (2018.05); *H01L 31/02325* (2013.01); *H01L 31/042* (2013.01); *H01L 31/054* (2014.12); *H01L 31/0547* (2014.12); *H02S 20/32* (2014.12); *H02S 40/20* (2014.12); *H02S 40/425* (2014.12); *F24S 2030/12* (2018.05); *Y02E 10/52* (2013.01)

(58) Field of Classification Search
CPC ............. H01L 31/054; H01L 31/0547; H01L 31/02325; H02S 40/20; H02S 40/22; H02S 20/32; F24S 23/12; Y02E 10/52
See application file for complete search history.

(56) References Cited

U.S. PATENT DOCUMENTS

| | | | |
|---|---|---|---|
| 3,780,722 A | | 12/1973 | Swet |
| 4,411,490 A | * | 10/1983 | Daniel ................ F21S 11/00 126/648 |
| 4,433,199 A | | 2/1984 | Middy |
| 5,089,055 A | * | 2/1992 | Nakamura ............ B64G 1/443 136/248 |
| 2002/0148497 A1 | | 10/2002 | Sasaoka et al. |
| 2008/0204990 A1 | * | 8/2008 | Kuo ...................... G06F 1/1616 361/679.27 |
| 2008/0271776 A1 | | 11/2008 | Morgan |
| 2008/0277565 A1 | | 11/2008 | Bookbinder et al. |
| 2009/0064993 A1 | | 3/2009 | Ghosh et al. |
| 2009/0107541 A1 | | 4/2009 | Linke et al. |
| 2010/0116319 A1 | | 5/2010 | Martinez Anton et al. |
| 2010/0139765 A1 | | 6/2010 | Mapel |
| 2010/0212717 A1 | | 8/2010 | Whitlock et al. |
| 2011/0232211 A1 | | 9/2011 | Farahi |
| 2013/0104979 A1 | | 5/2013 | Huang |

(Continued)

FOREIGN PATENT DOCUMENTS

| | | |
|---|---|---|
| CA | 2564835 | 4/2008 |
| DE | 2631194 | 2/1978 |

(Continued)

*Primary Examiner* — Lindsey A Bernier
(74) *Attorney, Agent, or Firm* — BainwoodHuang (57) ABSTRACT

A photovoltaic chip is designed to receive light energy from a light box arranged above it. The light can be sunlight guided by optical-fibers. For ease of replacement the photovoltaic chips can be supported in a carrier which is movably housed in a block. The blocks are housed on racks and are movable for ease of repair and replacement.

12 Claims, 8 Drawing Sheets

(56) References Cited

U.S. PATENT DOCUMENTS

2014/0202522 A1 7/2014 Nunez Bootello et al.
2015/0034144 A1 2/2015 Stone et al.
2015/0125113 A1 5/2015 Schreiber et al.

FOREIGN PATENT DOCUMENTS

| EP | 2204606 | 7/2010 |
|----|---------|--------|
| FR | 2310308 | 12/1976 |
| RU | 102747 | 3/2011 |
| WO | 2018119994 | 7/2018 |

* cited by examiner

PHOTOVOLTAIC SOLAR CONVERSION

FIELD

The present invention is in the field of photovoltaic energy and relates to photovoltaic solar conversion.

BACKGROUND

A number of solar energy conversion methods and related technologies have now been integrated into the mix of large-scale energy production systems in many parts of the world. Systems and processes are known that convert sunlight directly to electricity via arrays of photovoltaic panels.

The majority of deployed photovoltaic systems are based on silicon semiconductor material, the native properties of which, combined with some engineering related issues, have constrained the achievable solar-to-electric energy conversion efficiency in production grade panels to a maximum of about 20%. A theoretical maximum for silicon-based solar cells of about 33.7% has been predicated; this is known as the Shockley-Queisser detailed balance limit [W. Shockley and H. J. Queisser, "Detailed balance limit of efficiency of p-n-junction solar cells," J. Appl. Phys. 32 pp. 510-519 (1961)]. An immediate consequence of the conversion efficiency constraint on production grade panels is the necessity to cover large areas of land or rooftops with silicon semiconductor material in order to achieve useful electric power generation capacities for individual households; this, in turn, means much larger land areas must be covered with silicon for utility-scale grid distribution.

All flat plate photovoltaic panels and concentrated photovoltaic systems installed today are made without provision for future upgrades to better panels or modules if such were to become available. Once installed, these systems are expected to be in service for 10 to 15 years. It is not expected that they would be upgradeable or replaceable if new, higher efficiency ones become available. There are economic and technical reasons for this. The most important are that (i) it would be expensive and therefore wasteful to replace some or all of the panels or modules, and (ii) it is simply not technically feasible with current design configurations for panels or modules.

With the current global push to derive more energy from renewable sources, new investments to improve photovoltaic technologies will be made. Inevitably, this will result in better devices and systems. It is therefore important that photovoltaic systems be designed with a provision for replaceable semiconductor devices that can be easily swapped out when better ones become available.

The relentless pursuit of perfection of photovoltaic devices requires that, whenever possible, power plants incorporating photovoltaic components be constructed in a manner that readily facilitates upgrading of the semiconductor components at reasonable cost. This is especially true since the infrastructure is generally expensive and expected to be in service for several decades.

SUMMARY

According to one aspect of the invention there is provided a photovoltaic solar conversion apparatus comprising: at least one photovoltaic chip arranged to convert sunlight into electrical energy; and at least one coupling device operable to secure one or more optical fibers in a configuration with a light transmission end-face arranged to couple sunlight transported by the optical fiber onto a photosensitive surface of the at least one photovoltaic chip.

The approach described in the following enables limitations in the existing approaches to be overcome. These limitations are rooted in the design philosophy of all current flat plate photovoltaic panels and concentrated photovoltaic modules. Conventional panels and modules are designed to integrate several functions of the solar-electric energy generation process into a single system. While this might appear to be a reasonable strategy, the inventor has recognized two major flaws. Technologies that involve semiconductors generally improve their performance every few years and, along the way, the cost of producing them also drops. However, the existing approach does not enable such improvement to be taken advantage of. Furthermore, it is rarely possible to optimize an engineering system comprised of many components in a single shot; this is especially so if different materials or structures are integrated to form a whole. In this particular case, the light collection process and the light-to-electricity conversion process cannot be easily optimized when a single structure is used for both. The first penalty paid for integration is fewer collected photons (light particles) and a constraint in where the light-to-electricity conversion process can take place; the second penalty is a lockout on upgrades to future semiconductor devices that perform the light-to-electricity conversion process. This latter impediment is particularly severe given that solar cell devices, like other semiconductor devices, routinely see periodic improvements in their conversion efficiencies every few years.

Photovoltaic modules designed in the spirit of the methodology described herein make it convenient, easy, and inexpensive to replace banks of semiconductor chips. This design makes it feasible to contemplate upgrading the performance of a photovoltaic plant every few years when improvements are made in the technology. Replacing the chip carrier and the bank of chips on it is relatively inexpensive compared to gutting an entire infrastructure. Furthermore, the approach guarantees that any photovoltaic plant constructed in this manner is future-proof.

Embodiments of the present invention described herein rely on a new methodology for harvesting and transporting sunlight using light transport guides such as optical-fibers. The light transport guides may take the form of optical-fibers, referred to herein as a fiber-optic waveguides in some places. It will be appreciated that the terms 'optical-fiber' and 'fiber-optic waveguides' may be used interchangeably. A cable may house several optical-fibers in a protective housing. Once it is coupled to fiber-optic waveguides, sunlight can be transported safely by routing the cables from a collection location to a conversion location where the energy can be converted into electricity. The distance over which sunlight might be transported can be as short as a few tens of meters away from where it is collected, or the distance can span a city, a country or even a continent as long as most fiber absorption losses and coupling losses can be minimized. The optical-fibers provide a point light source. A point source has a defined and homogeneous light beam area, having a strong illumination focus, producing a sharply defined and evenly lit luminous spot. In a point source, the area from which the light emanates must not be large, i.e. must not form an 'extended source', since an extended source has different characteristics that make it work without having to integrate optics to pre-shape the beam profile.

The photovoltaic solar conversion apparatus may comprise a carrier on which the at least one photovoltaic chip is supported. The chip carrier (with the chip(s)) may be supported on a thermally conductive casing.

The chip carrier of the photovoltaic solar conversion apparatus may further comprise a projecting member configured to be received in a slot within the casing to thereby removably retain the carrier with respect to the casing.

The photovoltaic solar conversion apparatus may comprise a component upon which the thermally conductive casing is movably mounted in such a way that enables it to be removed from the apparatus. The component may be a rail in a shelf on which the casing may roll or slide. The thermally conductive casing may comprise a handle for removing the casing from the apparatus for ease of access to the chip carrier.

The coupling device of the photovoltaic solar conversion apparatus may comprise a light box arranged to receive at least one or more optical fibers, the light box comprising an optical guide to evenly distribute sunlight from the light transmission end-face onto the at least one photovoltaic chip. When the photovoltaic solar conversion apparatus comprises a chip carrier which supports a plurality of photovoltaic chips, there may be a corresponding plurality of light boxes, each light box device arranged to couple sunlight transported by the optical fiber to its corresponding photovoltaic chip.

The photovoltaic solar conversion apparatus may comprise a rack having at least one horizontally disposed rack mounting wherein the coupling device is fixedly mounted on the rack with respect to the rack mounting. The chip carrier may be mounted and can be moved with respect to the rack mounting for ease of replacement, for example by removing the casing in which the carrier is supported.

The light boxes in the photovoltaic solar conversion apparatus may be arranged horizontally adjacent to one another, each aligned with a respective photovoltaic chip in the carrier, and the light cabinet may comprise multiple racks, each rack having at least one fixed light box coupling device properly oriented with respect to a respective carrier on its associated rack mounting.

The rack in the photovoltaic solar conversion apparatus may have at least one optical fiber intake associated with each rack mounting for guiding the one or more optical fiber to the coupling devices from a remote location.

The casing in the photovoltaic solar conversion apparatus may comprise a cooling duct for receiving a coolant.

According to a second aspect there is provided a method of replacing photovoltaic chips in a photovoltaic solar conversion apparatus comprising: a plurality of photovoltaic chips, each chip arranged to convert sunlight to electrical energy; and a light coupling device associated with each photovoltaic chip operable to secure one or more optical fiber in a configuration with a light transmission end-face arranged to couple sunlight transported by the optical fiber to a respective photosensitive surface of each chip, the method comprising: providing the photovoltaic chips on a chip carrier which is movable with respect to the coupling devices; and removing chip carriers from the photovoltaic solar conversion apparatus while leaving the coupling device in place; and inserting a new chip carrier in the photovoltaic solar conversion apparatus while leaving the coupling device in place.

In one example of the second aspect the step of removing the chip carrier comprises sliding a casing in which the chip carrier is supported out of a rack in the photovoltaic solar conversion apparatus wherein the coupling device is fixed with respect to the rack. Alternatively, the step of removing the chip carrier may comprise rolling a casing in which the carrier is supported out of a rack in the photovoltaic solar conversion apparatus wherein the coupling devices are fixed with respect to the rack. Alternatively the coupling device may be movable while the carrier is fixed, or both may be movable. In use, each coupling device is aligned with its chip and in replacement the chips of the carrier and/or the carrier are rendered accessible.

According to a third aspect there is provided a replaceable cell bank comprising: a carrier on which is formed electronic circuitry for connecting at least one photovoltaic chip to one or more output terminals for the electricity generated by the photovoltaic chips; at least one photovoltaic chip supported on the carrier with an upper surface exposed to receive illumination from a light source external to the carrier, wherein the carrier is movable with respect to the light source, wherein the carrier comprises a means for removably coupling it to a casing.

In one example of the third aspect the coupling means comprises a tongue adapted to slide in a slot set within the casing.

The light transport waveguide may be capable of delivering sunlight along its length for distances of up to 1 km with minimal loss on the order of 10 dB per kilometer or less over the spectral band in which most solar energy is contained. For example, suitable light transport waveguides may be capable of transporting light rays that span the wavelength range from 350 nm to 2,500 nm, which corresponds to the spectral band where most (around 95%) of solar energy reaching earth is concentrated.

By separating out the collection of the light from its use, it is possible to consider methods and structures which allow for simple upgrading of technical components of the apparatus. For example, according to embodiments described herein a light cabinet is described which has racks for accommodating a scheme for converting sunlight to electricity using photovoltaic solar cell technology. The solar cells can be in the form of chips whose sizes can range from a few square millimeters to several tens of square centimeters. The transported sunlight is delivered to the racks via the light transport guides, and the same light transport guides can be used to distribute light over the solar cell chips. Alternatively, light transport guides can be connected together. The chips may be mounted on carriers, and both the bank of chips and the carriers on which they are mounted may be standardized to allow easy replacement of the chips (by replacing an entire chip carrier with a new one that possesses a new bank of chips).

A particularly advantageous method of coupling sunlight from a fiber-optic cable onto the solar cell chip is further described herein. The sunlight is coupled into a light box where several delivery fibers inject light into a cavity so that light from multiple fibers can mix and scatter at engineered surfaces and at an optical diffuser attached to the surface of the light box that faces the solar cell chip. The output of the diffuser may be a uniform square or rectangular shaped beam of light whose size precisely matches the size of a solar cell chip under the light box.

The solar cell chip carriers may be mounted on a high thermal conductivity material such as copper to provide a thermal management scheme for the chips. A coolant piping system may be embedded within the block of high thermal conductivity material so as to allow delivery of coolant into and out of the block. Such a thermal management scheme may be integrated to an external heat exchanger to form a closed loop cooling system.

For a better understanding of the present invention and to show how the same may be carried into effect, reference will now be made by way of example to the accompanying drawings.

DETAILED DESCRIPTION

The present embodiments provide a mechanism that facilitates a quick and easy replacement of photovoltaic semiconductor devices that convert light to electricity. They are discussed in the context of a system in which sunlight is harvested and transported using optical fibers.

Figure 1A:
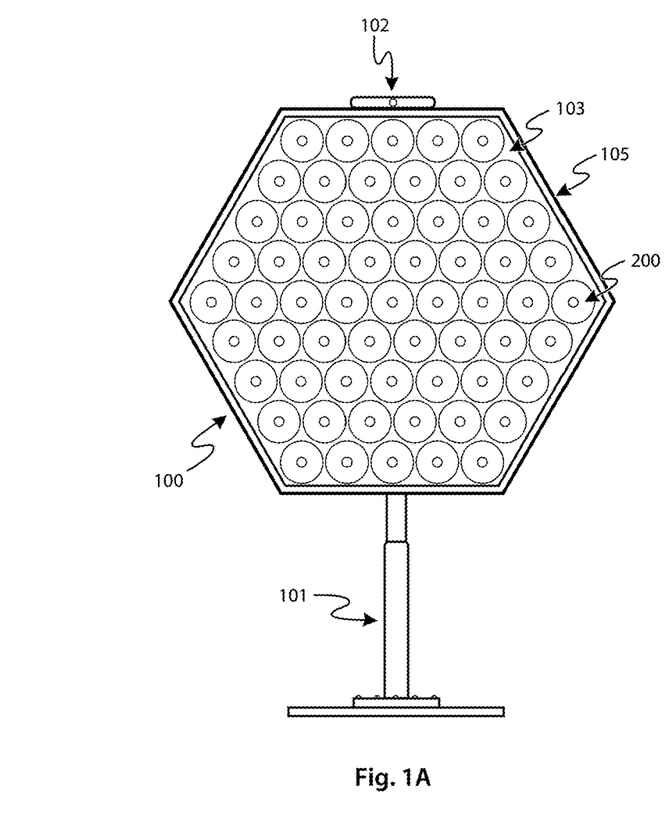
FIG. 1A shows an array of solar collector modules for harvesting sunlight at a collection location.
Figure 1B:
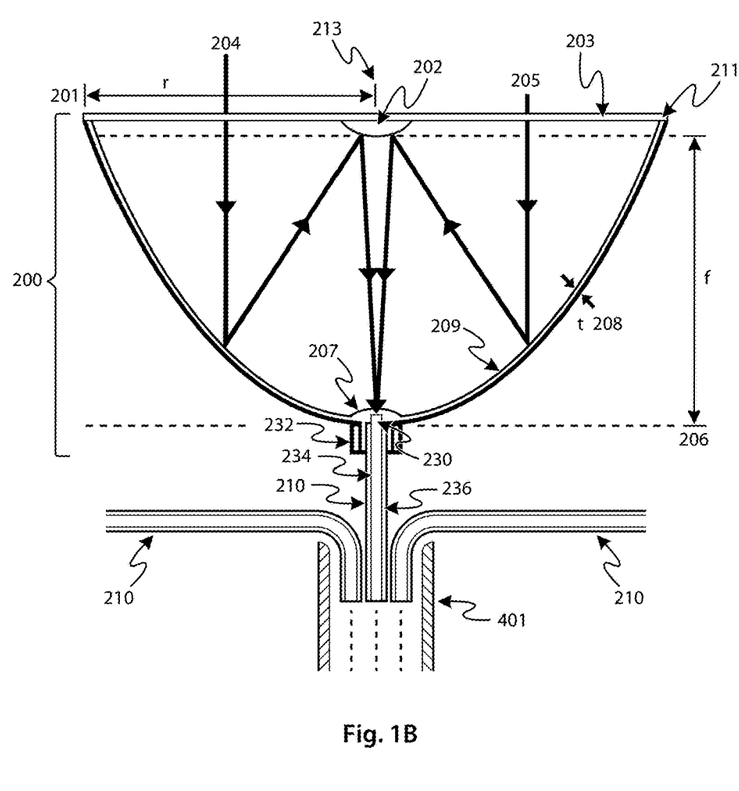
FIG. 1B is a sectional view through a solar collector module

FIGS. 1A and 1B illustrate a solar collection system which comprises one or more arrays 100 of solar collector modules 200. Each solar collector module is dish-shaped and acts to receive sunlight rays 204 and 205 from its upper flat or open surface and to direct that sunlight using optical components to a light receiver 210 located at the lower central region of the dish. In the described embodiments, the light receiver 210 is a fiber-optic waveguide 210. The fiber-optic waveguide 210 from each solar collector module in the array can be collected together and housed in a fiber-optic cable 401 for each array.

In the present description, the term optical-fiber is used interchangeably with fiber-optic waveguide to denote a long cylindrical silica glass core surrounded by a cladding whose index of refraction is smaller than that of the core. The cladding in turn is surrounded by a protective polymer coat. The entire structure is encapsulated in a hard but flexible protective outer polymer layer called the jacket. The term fiber strand is used herein to denote a single optical-fiber waveguide. The phrase 'optical-fiber (or fiber-optic) cable' is used to denote a tough protective thermoplastic housing with multiple optical-fibers for the purpose of light transport. 'Super' cables can be provided for carrying multiple cables over long distances.

The revolutionary arrangement described herein thus enables sunlight to be collected at a location where sunlight is plentiful (a collection location), and transported to a location separated from the collection location. The distance of separation could be small or large, and is limited only by the possible length of fiber-optic cables and management of absorption losses. Once coupled into fiber-optic waveguides, sunlight can be transported safely by routing the fiber-optic cables to any desirable location where the sunlight energy can be further processed or manipulated into a desired form (electrical or thermal). The distances over which sunlight might be transported can be as short as tens of meters away from where it is collected, or the distances can span a city, a country or even a continent as long as most fiber absorption losses and coupling losses can be minimized.

The embodiments of the invention described make use of a radical new approach that separates the process of harvesting sunlight from its immediate utilization or conversion to other forms of energy. Instead of the integrated approaches which have been developed in the past, the present approach separates the processes involved in solar energy harvesting and the use of that energy.

FIG. 1A shows an assembly of paraboloid solar collector modules 200 in an array 100 on a supporting surface 103 which is mounted on a pedestal 101. The pedestal 101 has a rack 105 on which the hexagonal collector array 100 is mounted. To follow the daily movements of the sun, the collector array 100 is provisioned with a two-axis, motor-driven (not shown) system for positioning and pointing the entire structure to the most optimal direction for collecting the most sunlight at any time during a sunny day. A solar tracking sensor 102 provides a control signal for driving a programmable logic controller [not shown] that controls the two-axis tracking system. Details of the two-axis tracking system and the programmable logic controller are not described further herein, because there are known systems which are currently used to control the angle of orientation of solar panels which could be adapted for this purpose. The individual collector modules can be arranged in the array in any two-dimensional geometric shape desired. However, the arrangement in this embodiment is such that the final geometric form, when looked at from a plan view, is a hexagon. This arrangement is preferred in some contexts because it is predicated on a geometric optimization principle that produces a hexagon as the ideal geometric form for the highest packing density (per unit area) for arranging dish-shaped, concave structures with circular rims, resulting in an effective coverage of about 91%.

Each collector module 200 may be designed to securely fit inside a holding substructure 103 in a manner to allow simple removal and replacement. Alternatively, a complete array of collector modules can be fabricated as a single structure which can easily be removed and replaced from the rack 105.

A single collector module 200 is shown in FIG. 1B. The collector module 200 is a hollowed-out paraboloid dish formed from an appropriately truncated parabola that is rotated about its origin. The dish has a focal length f 206 measured from a point 213 at the center of the circular upper area of the dish along the central axis, to a collection region 207 at the surface of the dish. In one embodiment the paraboloid collector module 200 is designed to have the radius r 201 of its circular rim 211 be exactly equal to the focal length 206 of the dish, but in other embodiments it is possible that the radius of the circular rim does not necessarily have to be equal to the focal length. Such a structure can be easily manufactured by casting from a single paraboidal mold. Alternatively, a large array of them arranged in the shape of the designed collector array 100 of FIG. 1A could be made in a single mold. The thickness t 208 of the wall of the collector module 200 may be minimized for any specific material out of which the module is made, subject to certain trade-offs mentioned below. For polymeric glass materials, such as poly-methyl-methacrylate (PMMA), also known as acrylic glass, it can be as thin as a few millimeters. The exact thickness can be chosen as an engineering trade-off between mechanical robustness and the weight of a single collector module (or array of modules). If it is too thin, it could be susceptible to damage from handling or ambient turbulence, but if it is too thick and therefore heavy, it could contribute too much weight to the total weight of the collector array 100. The total weight of the collector array 100 should directly balance a need for structural robustness and a requirement for low power for operating the tracking systems that control the alignment and pointing of the array 100 to the optimum position of the sun. For an array made from acrylic glass material, a thickness of 1 mm for the module material would be ideal; this would result in the weight of a single, completely sealed collector module being 41.56 grams if the external rim diameter is 15 cm, and its internal rim diameter is 14.9 cm. For this illustrative example, we have taken the radius of the module to be equal to its focal length. The weight of 64 such collector modules would be about 2.66 kg (assuming a density of grams/cm$^3$ for PMMA).

While a paraboloid collector module 200 is described herein, it will readily be appreciated that different shapes may be utilized. What is required is a collector module that is capable of receiving solar radiation, with optical components that guide the solar radiation to a light receiver in the form of an optical-fiber. In the present embodiment, a concave collection surface is provided which is reflective and which is configured to collect sun rays and to reflect them towards a location at which a mirror is mounted. The mirror receives sun rays reflected from the collection surface and redirects them to a light collection point where a light receiver such as an optical-fiber can be coupled. Any shape which satisfies these criteria, with any suitable optical guiding components may be utilized in accordance with the principles described herein.

In the embodiment described herein the solar collector apparatus comprises collector modules which utilize reflection to collect and guide the sunlight onto the light receiver. Once the principle of separately harvesting the sunlight at a collection location, and guiding it using optical fibers to a utilization location is understood, it will readily be appreciated that other alternatives may be available for collecting the sunlight. For example, sunlight may be collected using refractive rather than reflective optics. Refractive optics involves use of lenses alone. It would be possible to use arrays of convex lenses or Fresnel lenses to focus the light to a point where a fiber can be placed to capture it. Having said that, there may be advantages to utilizing reflective optics. Achieving the right precision on a large array of lenses involved in refractive optics may be harder than achieving the same precision using mirrors. Furthermore, some lenses have a defect called 'chromatic' aberration that may be unavoidable, while mirrors do not suffer from this. Another important consideration is weight. Conventional lenses need to have a thickness to refract light, which adds weight. A mirror on the other hand may be as thin as required. Unless, however, the lens is a meta-lens, which may be comprised of microscopically engineered surface features that permit fabrication of a flat lens for focusing of a certain wavelength band; full spectrum meta-lenses are still challenging to fabricate.

To enhance proper functioning, the concave inner lining of each module 200 in the collector array 100 should desirably be coated with a broadband high reflectivity film 209 or stack of films. The reflectivity for the inner lining 209 for each module 200 in the array could be 100% for sunlight wavelengths spanning the spectral range from 350 nm to 2500 nm. Most energy (about 95%) from the sun reaching earth is concentrated within this spectral band. The energy is distributed non-uniformly in the solar spectrum. It is estimated that about 4% is contained between 300 nm and 400 nm; 42% between 400 nm and 700 nm, and 52% between 700 nm and 2500 nm. In a fully assembled collector array, each module 200 in the array has a thin transparent glass cover 203 extending over the open area defined by the rim 211 of the dish; this may be made from lightweight, durable, and ultraviolet-resistant plastic material. The cover 203 serves the dual role of protecting the concave inner lining 209 of the module from the elements as well as acting as an input port for parallel incident solar radiation rays 204 and 205 into the collector module. Solar radiation rays, such as 204 and 205, are reflected from the inner lining 209 and, because of the particular parabolic curvature of the module, redirected toward the focal point 213 of each dish in the vicinity of the center of the cover glass. A perfect hyperboloid mirror reflector 202, attached to the center of the cover 203 and positioned in the vicinity of the dish focal point, retro-reflects and refocuses the light to the bottom of the dish to the collection region 207, below which is attached a fiber-optic waveguide 210 with an appropriate numerical aperture. Here, numerical aperture is defined as a dimensionless parameter that characterizes the range of angles of incident light rays that are successfully captured by the fiber and are thus readily transported along its length.

The fiber-optic waveguide 210 may be attached by any suitable mechanism. In one embodiment, a screw thread around a ferrule can be created at the fiber tip 230, and a corresponding threaded body 232 can be provided at the collection point 207 of the collector module such that the tip 230 of the fiber-optic strand can be screwed into the threaded region at the bottom of the module. Technology for securing optical-fibers to curved and planar surfaces is known and may be adapted for use herein.

The fiber-optic waveguide 210 may have a circular cross-section core waveguide 234 whose diameter may range from a minimum of 100 microns to 1 millimeter and whose cladding thickness can range between 150 microns and 1 millimeter. It will readily be appreciated that other dimensions may also be appropriate, depending on the context. In some examples, a fiber-optic waveguide for a single collector module could be capable of transporting a minimum of 10 W of sunlight for a distance of at least 1 km with minimal loss (<10 dB/km) over most of the spectral band in which the majority of solar energy is contained. Greater distances may be enabled depending on the context. Over the majority of the spectrum, the loss should be below 5 dB/km. For good performance and to maximize efficiency, the fiber-optic waveguides 210 should exhibit broadband transmission of sunlight beginning from the wavelength of 350 nm and ending at the wavelength of 2500 nm. The inventor has recognized certain spectral features of sunlight when considering the transportation requirements which have not hitherto been studied in depth; they have recognized that it is desirable that the sunlight transmission capability of the fiber between the wavelengths of 350 nm and 450 nm be greater than 20%, and between 450 nm and 700 nm, it should be greater than 85%, and between 700 nm and 1700 nm it should be 90% or greater, except for a narrow band of about 20 nm centered around the atmospheric water vapor absorption line at the wavelength of 1430 nm, where the transmission may dip to almost zero. This dip is of no consequence because there is little to no incident solar radiation at this wavelength due to atmospheric absorption of sunlight. The inventor has recognized that this is because the same absorption mechanisms (water molecules and hydroxyl ions) in the atmosphere are also present in the manufacture of glass fibers (from humidity in the air). Between the wavelengths of 1450 nm and 1900 nm, the fiber transmission should preferably be greater than 85%, and between 1900 nm and 2000 nm, it should preferably be better than 30%. For the remainder of the solar spectrum between 2000 nm and 2500 nm, the fiber transmission is expected to be between 15% and 20%. Low transmission in the last spectral region should not be a problem because the amount of solar energy carried in this portion of the spectrum is less than 1%. What is critical is that the spectral transmission characteristic of the fiber should closely follow the distribution of solar energy reaching earth as described above. This means that where there are dips in the solar energy spectrum reaching earth, the fiber may have similar dips in transmission since there is little energy to transmit. Overall, however, the delivery of sunlight through a fiber-optic waveguide should incur very little loss of light, certainly no more than 10 dB/km at worst but below 5 dB/km at best, over the spectral band in which most solar energy is contained.

There are a number of possible uses of sunlight transported in the manner described above. Reference will now be made to FIGS. 2A, 2B, 2C, 2D and 2E to describe a method and architecture for electricity generation which enables simple replacement of photovoltaic cells.

This approach removes constraints of existing photovoltaic panels which integrate the sunlight gathering surface onto the conversion substrate, making it impossible to contemplate other uses of the collected sunlight or replacing any of the components when it is technically necessary.

Figure 2A:
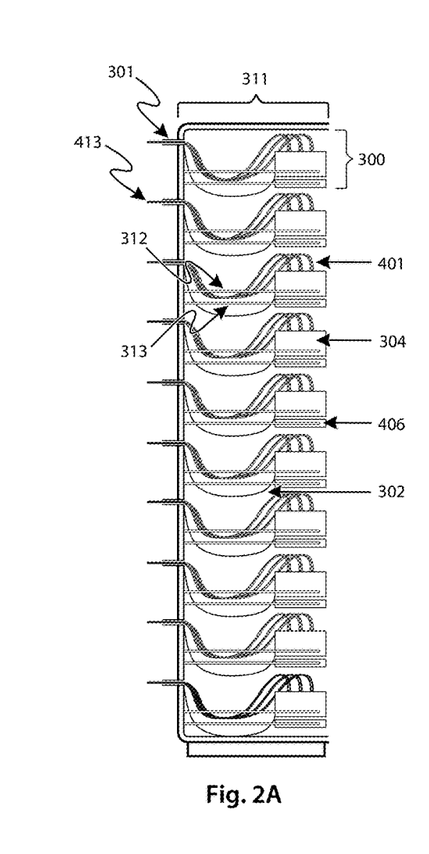
FIG. 2A is an open side view of a light cabinet
Figure 2B:
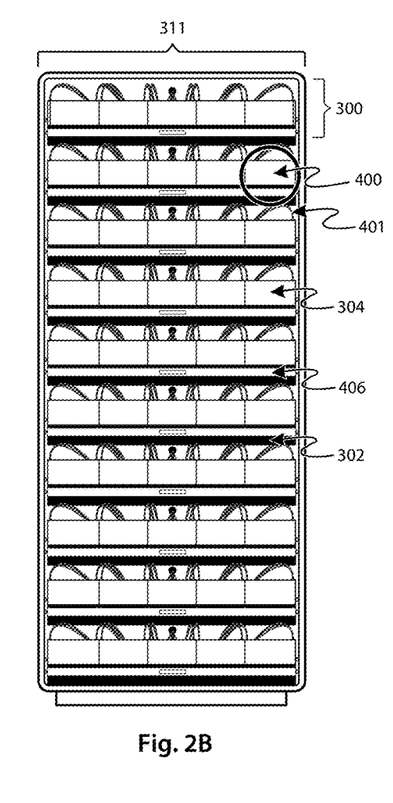
FIG. 2B is front open view of a light cabinet
Figure 2C:
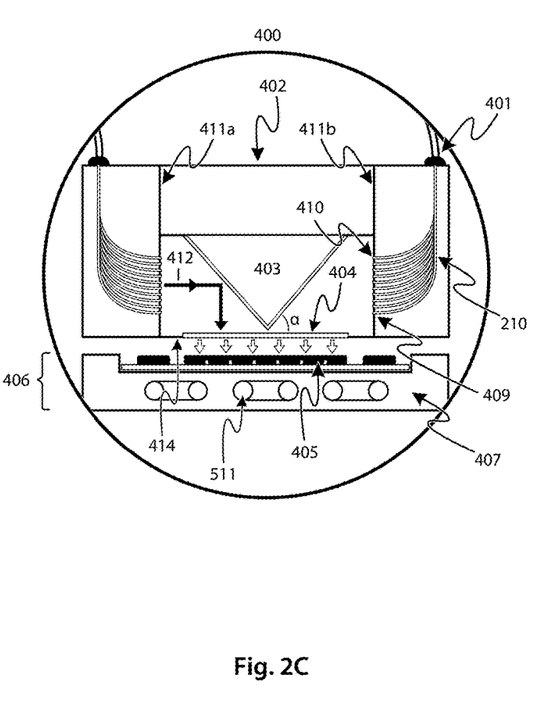
FIG. 2C is a detailed sectional of view through an electrical conversion assembly

FIG. 2A shows a light cabinet 311 from a side view with a plurality of racks 300 vertically spaced within the light cabinet 311, each containing rack mountings 312 and 313 vertically spaced within the rack 300. There could be one or more light cabinets 311 in a special shed or room inside a building where solar energy is converted to electricity. The ends of the fiber-optic cables 401, remote from the collector array(s) are received by respective intakes 301. In this way the 'super' fiber-optic cables 413, transporting sunlight, enter the light cabinet 311 and are distributed among the various racks 300 contained therein. As shown in FIG. 2A, these may be an intake 301 per rack 300, but other configurations are possible. Each rack mounting 312 is provided with an excess cable cradle 302 to take up any slack that might be necessary. In entering the rack 300, each 'super' fiber-optic cable is separated into at least two fiber-optic cables 401. The incoming fiber-optic waveguides housed in the fiber-optic cables are guided towards light boxes 304. Each rack mounting 312 may have one or more light boxes; five per rack mounting 312 are shown in FIG. 2B by way of example. Each optic-fiber cable 401 terminates at a ferrule 409 that guides the fibers into the expanded view of light box 400 of FIG. 2C. In the example given, each light box 304 takes the form of a container with four side walls, two of which are denoted 411A, 411B, an upper surface 402 and a lower surface 414, the box receives fibers from one or more cables. The fibers are delivered individually into point guides 410 arranged in a rectangular m×n matrix format (m<n) on either sidewall of the light box. This is shown in FIG. 2C. Each light box 304 is aligned on top of a solar cell chip 405 inside a drawer 406. The number of fibers depends on how large each solar chip is and how much electrical power one wants to generate from the chip. Since this is a question for how much capacity a user wants, it may be specified as a design parameter. At a possible minimum, each light box over a chip can generate up to 1 kW. This may be translated to either 100 fiber strands which provides up to 1000 W where each fiber carries 10 W, or 64 fibers where each fiber caries 20 W per fiber to give a total of 1280 W, from a chip. Other configurations are possible. The preceding examples are given by way of illustration only.

Details of how the light box interfaces with the solar cell chip are shown in the expanded view 400 of FIG. 2C. Each fiber waveguide 210 in the fiber-optic cable 401 is fed through a ferrule 409 acting as a point guide in the wall that guides it into light box 304. The external side walls of the box should preferably be made from optically opaque materials such as anodized aluminum. In the detailed illustration in FIGS. 2D and 2E, the interior of the box 304 is a specially designed cavity 110 into which each fiber 210 delivers its output beam 412. Special fiber terminators can be used at the tips of the fibers to obtain desired beam shapes within the cavity. In general, it is known that a fiber tip can be flat, lens-shaped, or any other desirable termination geometry for a particular exit beam shape. For the purposes of the light box, the desired fiber tip shape should result in an exit beam that is Gaussian. Most of the cavity 110 is empty space except for a triangular-shaped prism 403 whose two surfaces facing the fibers are covered with dielectric reflecting coatings. The angle of the inclined sides of the prism, with respect to the horizontal lower surface of the box, is chosen such that light incident onto them from the fibers is reflected downward toward a first microstructured optical diffuser 404. In the present embodiment, the illustrated angle α is 45°. Other angles may be utilized, for example in the range 30° to 60°. The requirement is to redirect the incoming beams in overlap in an illumination zone. Multiple beamlets such as designated by 412 from the fibers 210 should overlap at the edge of the first optical diffuser 404 because of diffraction at the exit of the fiber. To achieve this, the total distance, from the beam exit at the fiber to the surface edge of the diffuser 404, should be chosen to guarantee beam overlap at the diffuser 404. A beam 412a is shown overlapping the beam 412 in FIG. 2E. A second diffuser 408 may also be used if necessary, below the first diffuser 404. Because of the angular spread of light from each fiber 210, and the distance from the beam exit to the edge of the diffuser, the beams from the fibers overlap and mix just before they reach the first diffuser 404. During transmission through the first diffuser 404, the beams are randomly mixed by the action of the microstructure in the diffuser. Light emerges from the other side with a substantially uniform distribution. If there is a second diffuser 408, the microstructure on the second diffuser 408 further randomizes the light, thus enhancing uniform distribution. The apparatus is constructed so that the output is a beam that is substantially of uniform intensity distribution and shaped to fit precisely over the active surface of the solar chip 405. This implies that the output surface of the last diffuser should be sized to have the dimensions of the active area of the solar chip 405.

While this might typically be a square or rectangle (for ease of manufacture), any suitable geometric shape could be utilized. Indeed, it is not essential that there is a precise match between the output surface of the diffuser and the active area of the solar chip, but it will readily be understood that it is much more efficient in terms of usage of the sunlight which has been transported through the fibers if this is the case.

In another embodiment, the diffused light from the fiber-optic waveguides 210 may be used to illuminate a panel of photovoltaic cells, such as is currently in use in external environments for the conversion of solar energy to electricity. The advantage derived from use of the apparatus described herein is that such a panel may be utilized indoors and therefore is not subject to environmental wear, as is currently the case. The current expectation is that illuminating photovoltaic panels of the known type may be less efficient than providing solar chips to capture the output of each light box, but that might not necessarily be the case.

Figure 2D:
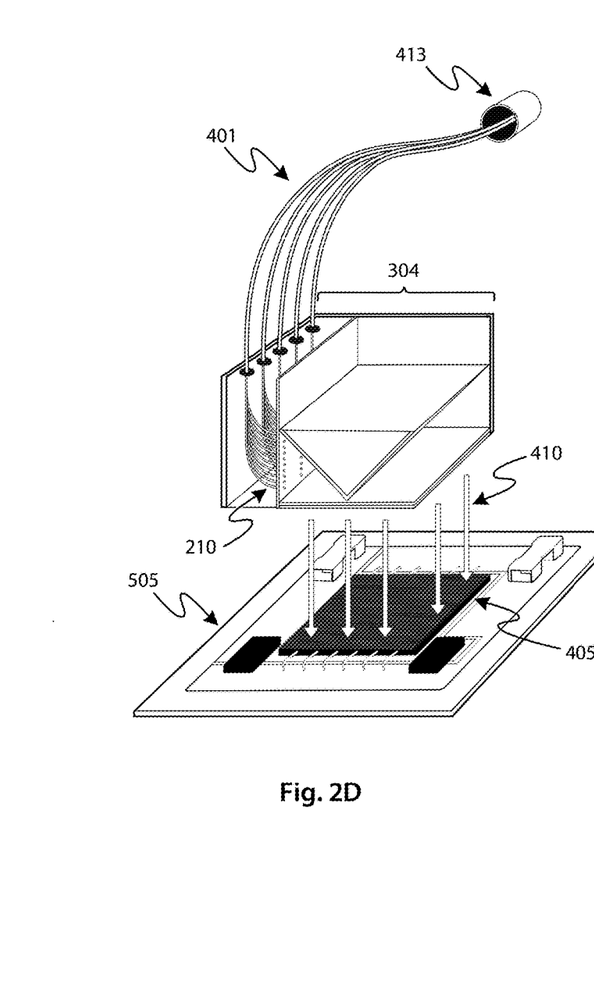
FIG. 2D is an expanded view of the electrical conversion assembly
Figure 2E:
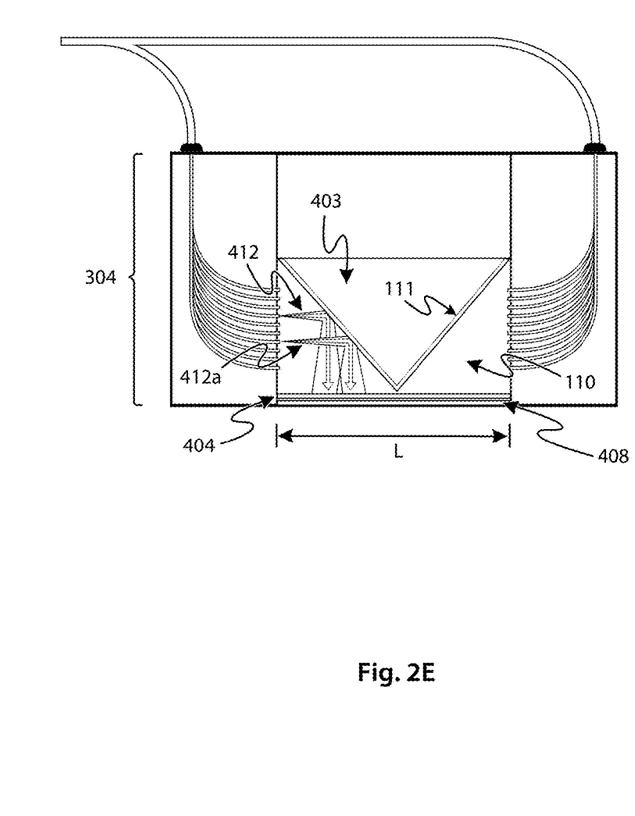
FIG. 2E is a sectional view through a light box

Reverting back to the embodiment described herein, FIG. 2D shows an expanded perspective view of the light box and chip carrier of the embodiment described herein. This shows a rectangular output from the diffuser directly matching the underlying solar cell chip on the chip carrier.

Figure 2F:
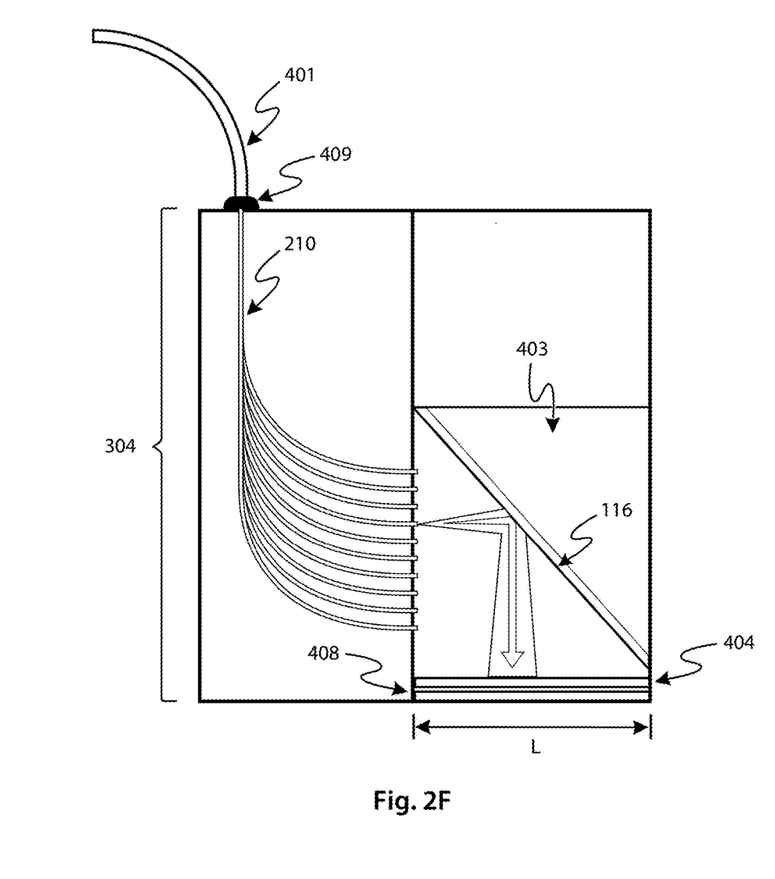
FIG. 2F is a sectional view of a light box

FIG. 2F illustrates a zoomed in section of FIG. 2D, showing one half of the arrangement in more detail. In an alternative embodiment, not shown, the prism may be replaced by a block of metal covered with a reflecting dielectric surface coating 116. This provides similar functionality to the prism, and may enable smaller light boxes to be constructed as they receive an array of light guides only from one side of the box.

Figure 3:
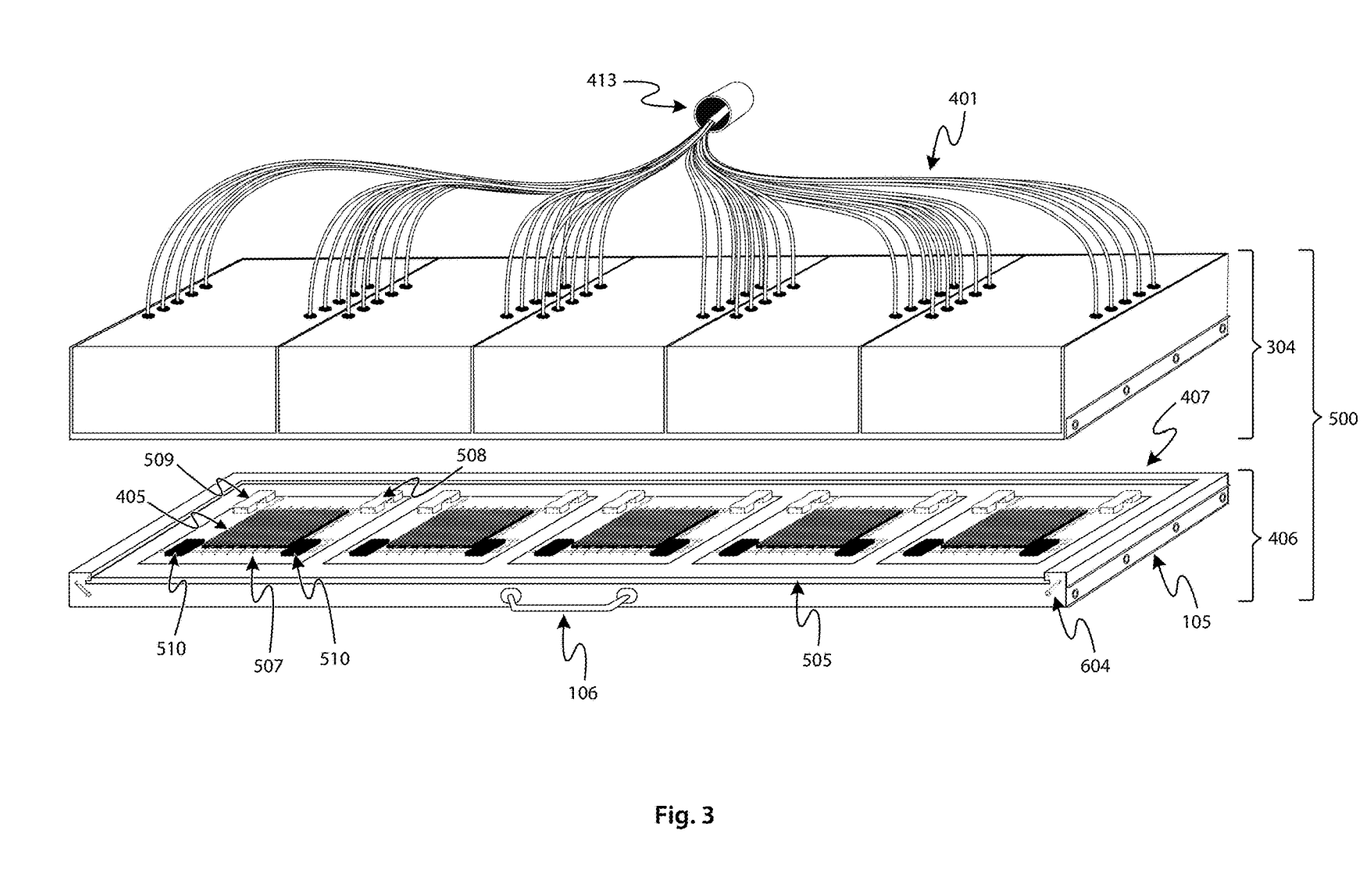
FIG. 3 is an expanded view of multiple electrical conversion assemblies associated with a rack of the cabinet

As shown in FIG. 2D, and more clearly in FIG. 3, the solar cell chips 405 are mounted in a carrier 505 inside a chip drawer 406. For heat dissipation purposes, the drawer should be conductive. It should have a casing 407 manufactured from oxide-free copper material because of its excellent thermal conductivity. Embedded within the copper casing block is a piping structure 511 that is used to circulate a coolant, such as chilled water, that transports away waste heat generated during operation of each solar cell. This may be necessary even in the best solar cell chips, if an unacceptably high fraction of incident sunlight is converted to heat, which would tend to degrade the performance of the conversion process.

FIG. 3 shows the details of the structure of an apparatus on a typical rack mounting 313 in a typical rack 300 of FIG. 2A. An assembled active conversion package 500 in FIG. 3 is comprised of the optic-fiber cable 401 that is separated into optic-fiber waveguides 210 that are fed into ferrules 409 that guide them into each light box 304, which interfaces with the cell drawer 406. Reference numeral 105 denotes a wheel/roller mechanism for rolling the drawer in and out. The cell drawer 406 is comprised of a copper block casing 407 on which is mounted a ceramic chip carrier 505 on top of which the solar cell chips 405 are attached and bonded by gold wires 507. The drawer 406 has a handle 106 so that it may be easily slid out from the rack. To manufacture the assembly, a ceramic chip carrier initially is covered with a thin layer of highly conducting metal (such as gold); this layer is then lithographically defined into separate regions that are electrically isolated. These isolated regions are in turn defined into two electrical regions: one negative and the other positive. A negative terminal 508 and a positive terminal 509 are attached between which the solar cell chip 405 is mounted. Bypass diodes 510 protect each solar chip from any potential excess and uncontrollable current generation process by short-circuiting the chip to ground in the event of such an occurrence.

Figure 4:
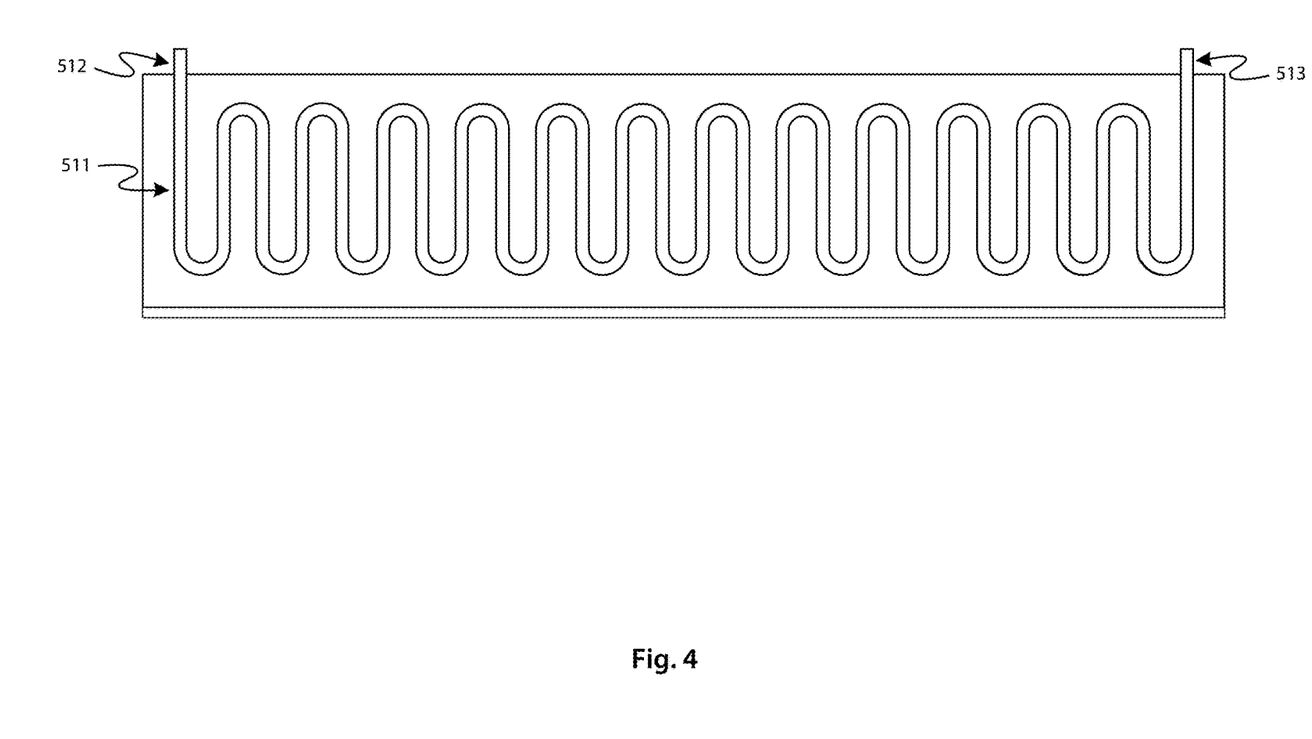
FIG. 4 is a plan view showing the coolant system placed under a chip carrier

As shown in FIG. 4, embedded inside the copper block 407 on which the ceramic solar chip carrier 505 sits is a winding pipe 511 that allows a cooling fluid, such as ethylene glycol diluted with water or pure water, to be circulated and taken out at outlet 513. Such a cooling system can be closed loop. After exiting the port 513, the coolant can then be fed into an associated heat exchanger before it is fed back into the copper block at an inlet port 512.

Figure 5:
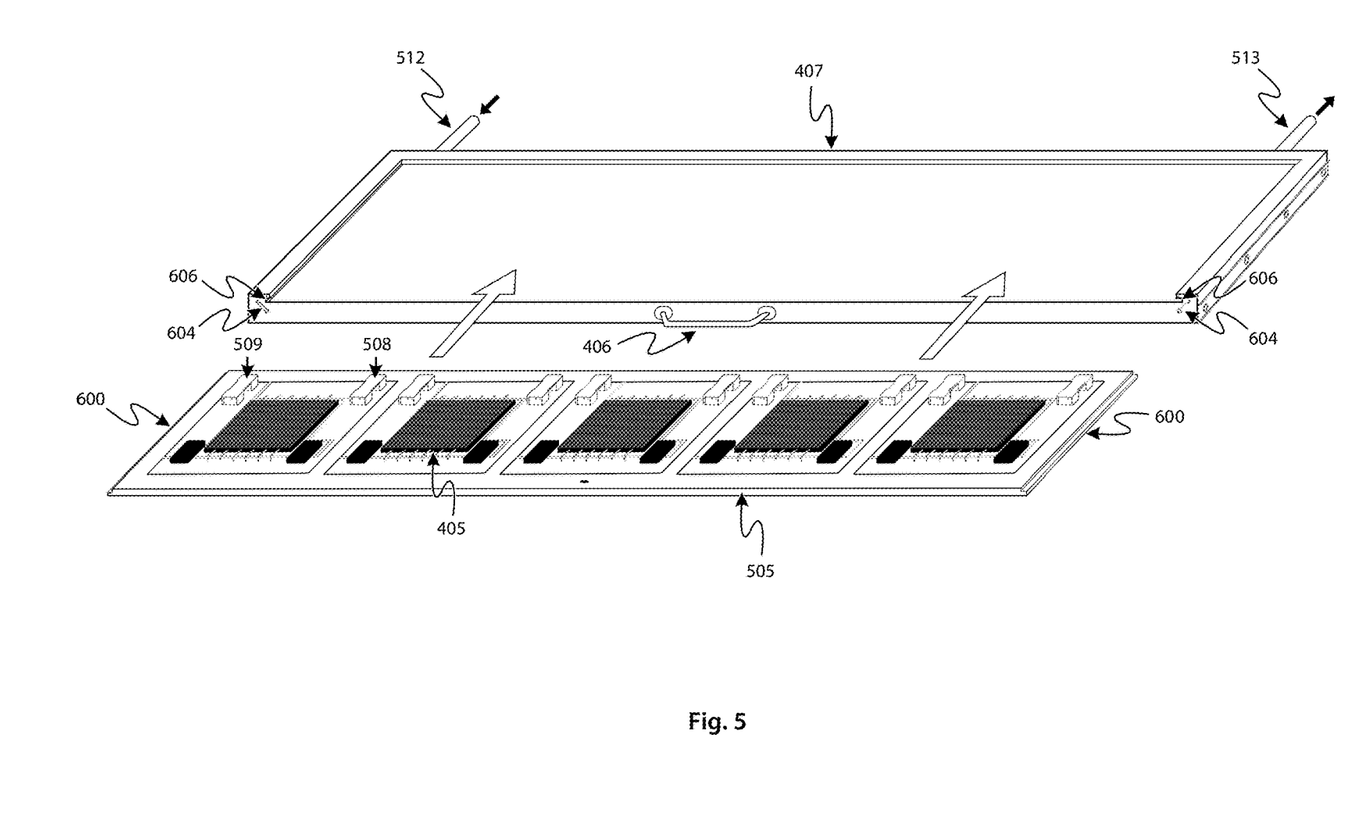
FIG. 5 is a perspective view showing the arrangement of a chip carrier within its carrier block

FIG. 5 illustrates details of the drawer comprising the copper block into which the ceramic chip carrier is installed. To make it easy to replace the bank of solar cell chips mounted on the carrier, each edge of the carrier is machined into a tongue 600 that fits into a slot 606 in the copper block 407. Once installed in the block, the carrier can be secured in place using latches 604 on the right and left side of the copper block carrying the ceramic carrier. Whenever necessary, the carrier can be removed by simply unlatching the mechanism and pulling it out. The carrier and the block should make intimate contact with each other to facilitate thermal conduction. Heat transferred to the block from the carrier is transported away by the coolant described above with reference to FIG. 4.

Figure 6:
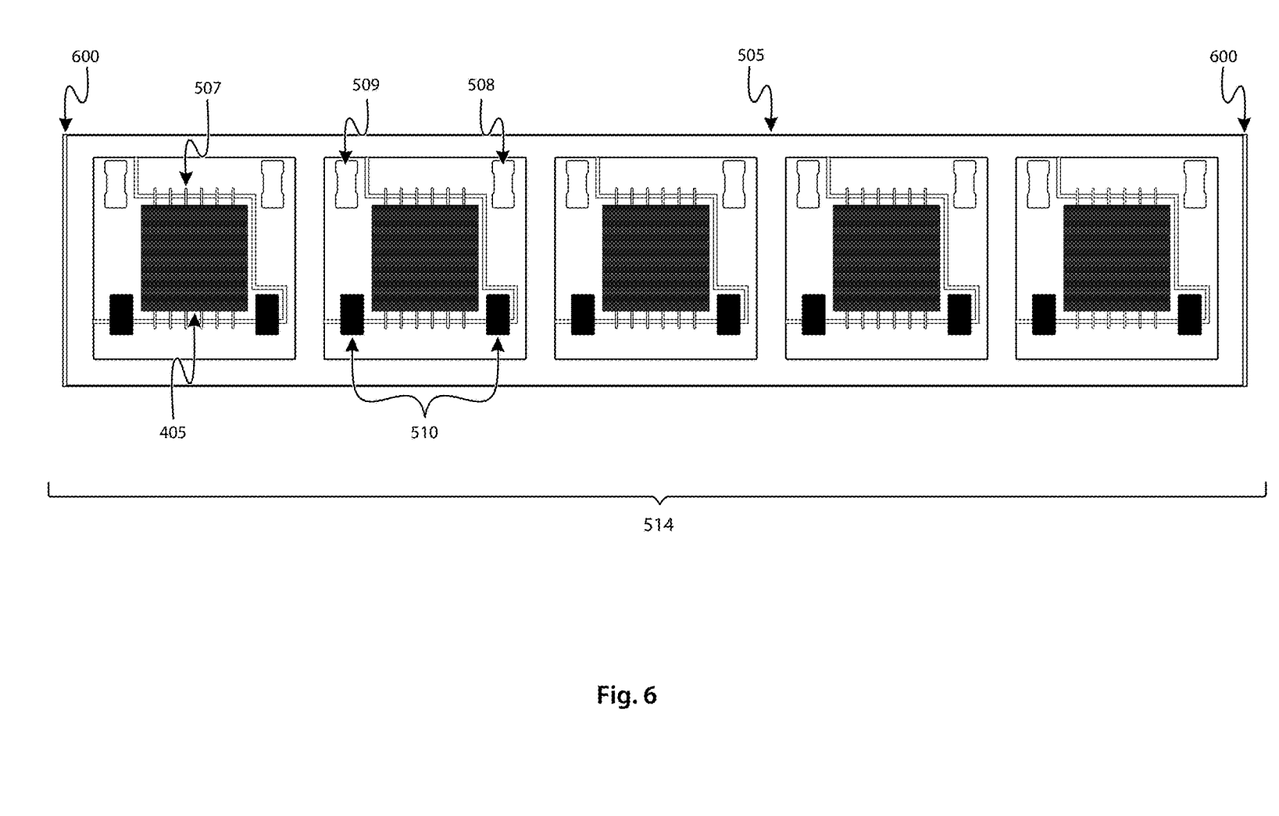
FIG. 6 is a plan view of a chip carrier carrying multiple PV chips

A ceramic carrier populated with a bank of solar cell chips is shown in FIG. 6. As discussed, each solar cell chip on the carrier is protected with bypass diodes in case of excessive electrical current. Electrical output from the solar cell chips is available from positive and negative terminals 508 and 509, respectively. Wire bonds on two sides of the cell and a thermally and an electrically conductive paste on the bottom side of the cell attach the p and n side of the solar cell diode to an appropriate output terminal. Also, as described earlier, the tongue 600 on each side of the ceramic carrier slots into the copper block 407 that serves as a heat sink.

Some of the advantages of the scheme described in this invention should now be apparent to those skilled in the art. By separating the function of light collection from light transport, and the light collection process from the conversion process, one effectively makes the photovoltaic system future-proof. Technology advances and developments that impact performance improvements in new solar cell chips can be readily taken advantage of. All that is required is removal of the old cell bank 514 on which solar cells are carried. New chip carriers (with new solar cells of higher performance) can then be readily swapped in to replace the old ones. FIG. 6 identifies a replaceable structure in the form of cell bank 514. The cell bank is the complete replaceable unit which comprises the carrier base 505, the cells 405 and the surrounding feature sets such as the diodes 510, wire bonds 507 etc. The cell bank can be slotted in and out of the casing 407 for replacement purposes once the casing has been removed from the rack, for example by sliding or rolling it out using the handle. For owners of installed systems, this is a less expensive option than replacing an entire infrastructure. This partial replacement option is available to both utility scale power plants and to individual home photovoltaic systems. Another advantage of the new general methodology is that it allows a relatively straightforward process for increasing generating capacity of existing power plants. If desired, several empty solar chip storage racks, earmarked for future capacity expansion can be included during the initial installation phase. The empty racks can be populated with solar cell chip carriers at a later date when additional capacity is needed or when funds become available. This unmatched flexibility to scale up or scale down could give large, renewable solar energy utility plant operators decided advantages over their competitors who rely on traditional coal or gas plants.

The invention claimed is:
1. A photovoltaic solar conversion apparatus comprising:
a plurality of photovoltaic chips arranged to convert sunlight into electrical energy;
a plurality of coupling devices operable to secure a plurality of optical fibers in a configuration with a light transmission end-face arranged to couple sunlight transported by the optical fibers onto photosensitive surfaces of the photovoltaic chips;

a carrier which supports the photovoltaic chips, with each of the coupling devices being arranged to couple sunlight transported by a respective one or more of the optical fibers to a corresponding photovoltaic chip; and a rack having a horizontally disposed rack mounting, wherein the coupling devices are fixedly mounted on the rack with respect to the rack mounting, and the carrier is movably mounted in alignment with the coupling devices with respect to the rack mounting for ease of replacement.

2. A photovoltaic solar conversion apparatus according to claim 1 comprising of a thermally conductive casing in which the carrier is supported.

3. A photovoltaic solar conversion apparatus according to claim 2 wherein the carrier comprises a projecting member configured to be received in a slot within the casing to thereby removably retain the carrier with respect to the casing.

4. A photovoltaic solar conversion apparatus according to claim 2 comprising a component upon which the thermally conductive casing is movably mounted.

5. A photovoltaic solar conversion apparatus according to claim 4 wherein the thermally conductive casing comprises a handle for moving the casing relative to the component for ease of access to the carrier.

6. A photovoltaic solar conversion apparatus according to claim 1 wherein each of the coupling devices comprises a respective light box arranged to receive the respective one or more of the optical fibers, each light box comprising one or more diffusers to evenly distribute sunlight from the light transmission end-face onto the respective photovoltaic chip.

7. A photovoltaic solar conversion apparatus according to claim 1 wherein the coupling devices are arranged horizontally adjacent to one another, each aligned with a respective photovoltaic chip in the carrier.

8. A photovoltaic solar conversion apparatus according to claim 1 further comprising a light cabinet including a plurality of the racks and a corresponding plurality of the carriers, each rack having respective ones of the coupling devices oriented with respect to a respective carrier on its associated rack mounting.

9. A photovoltaic solar conversion apparatus according to claim 1 wherein the rack has at least one optical fiber intake associated with the rack mounting for guiding the optical fibers to the coupling devices from a remote location.

10. A photovoltaic solar conversion apparatus according to claim 2 wherein the casing comprises a cooling duct for receiving a coolant.

11. A photovoltaic solar conversion apparatus according to claim 1 wherein:

the carrier includes electronic circuitry for connecting the photovoltaic chips to one or more output terminals for electricity generated by the photovoltaic chips; and the photovoltaic chips are supported on the carrier with an upper surface exposed to receive illumination from the optical fibers, wherein the carrier is movable with respect to the optical fibers, and wherein the carrier comprises a coupling means for removably coupling the carrier to a casing.

12. A photovoltaic solar conversion apparatus according to claim 11 wherein the coupling means comprises a tongue adapted to slide in a slot set within the casing.

\* \* \* \* \*